United States Patent [19]

Katsube et al.

[11] 4,010,291

[45] Mar. 1, 1977

[54] METHOD OF MAKING A LOW RESISTANCE INDIUM OXIDE CONDUCTIVE FILM

[75] Inventors: Yoshiyuki Katsube; Shizuko Katsube, both of Ikeda, Japan

[73] Assignee: Agency of Industrial Science & Technology, Tokyo, Japan

[22] Filed: Oct. 20, 1975

[21] Appl. No.: 624,189

[30] Foreign Application Priority Data

Dec. 16, 1974 Japan .............................. 49-144804

[52] U.S. Cl. ................................ 427/126; 204/192; 427/101; 427/109; 427/248 B
[51] Int. Cl.$^2$ ...................... B05D 5/12; C23C 15/00
[58] Field of Search .............. 204/192 SP, 192 OP, 204/192 FR; 427/101, 109, 126

[56] References Cited

UNITED STATES PATENTS

| | | | |
|---|---|---|---|
| 3,506,556 | 4/1970 | Gillery et al. | 204/192 |
| 3,655,545 | 4/1972 | Gillery et al. | 204/192 |
| 3,749,658 | 7/1973 | Vossen, Jr. | 204/192 |
| 3,764,280 | 10/1973 | Lupinski | 427/126 X |
| 3,874,922 | 4/1975 | Mickelson | 204/192 X |
| 3,907,660 | 9/1975 | Gillery | 204/298 |

OTHER PUBLICATIONS

J. L. Vossen, "RF Sputtered Transparent Conductors – The System $In_2O_3$–$SnO_2$," *RCA Review*, vol. 32, June 1971, pp. 289–296.

J. C. C. Fan et al., "Properties of Sn–Doped $In_2O_3$ Films Prepared by RF Sputtering," *J. Electrochem Soc.*, vol. 122, pp. 1719–1725 (1975).

D. B. Fraser et al., "Highly Conductive, Transparent Films of Sputtered $In_{2-x}Sn_xO_{3-4}$," *J. Electrochem Soc.*, vol. 119, pp. 1368–1374 (1972).

*Primary Examiner*—Anthony Skapars
*Assistant Examiner*—Aaron Weisstuch
*Attorney, Agent, or Firm*—Armstrong, Nikaido & Wegner

[57] ABSTRACT

A low resistance indium oxide conductive film is made on a substrate in an atmosphere for vacuum evaporation or sputtering where aqueous vapor or gas mixed with the vapor is introduced or wherein aqueous vapor is generated, by reactive vacuum evaporation or sputtering in said atmosphere using indium oxide or metallic indium as starting material.

4 Claims, No Drawings

METHOD OF MAKING A LOW RESISTANCE INDIUM OXIDE CONDUCTIVE FILM

BACKGROUND OF THE INVENTION

Heretofore, indium oxide conductive films have been made by a vacuum evaporation process wherein indium oxide is vacuum evaporated by electron beam heating or metallic indium is reactively evaporated in an oxygen atmosphere, or by a sputtering process wherein indium oxide is used as a target or a reactive sputtering is carried out in a gas including oxygen and using metallic indium as a target. However, indium oxide conductive films produced by these prior processes have a wide dispersion of values of measured resistances, and, therefore, it is very difficult to make films having a constant film resistance. Furthermore, most of them usually have higher values of resistance than desired. This tendency is particularly large when using metallic indium as a starting material. Accordingly, such a phenomenon has heretofore been a large obstacle to the production of indium oxide conductive films.

BRIEF SUMMARY OF THE INVENTION

It is an object of this invention to provide an improved method of making low resistance indium oxide conductive films. It is another object of this invention to provide an improved method of making low resistance indium oxide conductive films having a substantially constant film resistance within a narrow variance. A further object of this invention is to provide low resistance indium oxide conductive films having superior electric and optical characteristics as well as an even distribution of the characteristics with high reproduceability by an industrial vacuum evaporation or sputtering process.

These and other objects are accomplished in accordance with this invention by the use of an atmosphere for vacuum evaporation or sputtering which includes aqueous vapor therein. That is to say, according to this invention the vacuum evaporation or sputtering process is effected in an atmosphere within a vacuum evaporation or sputtering chamber in which aqueous vapor or gas including aqueous vapor is introduced or aqueous vapor is generated therein. Indium oxide or metallic indium is then used as a starting material and thus an indium oxide conductive film having low resistance is deposited on a substrate.

This invention is based on the novel discovery that in the case of indium oxide conductive films made by a vacuum evaporation or sputtering process and having low resistance values, the conductivities of said conductive films are for the most part due to absorption (chemical absorption) of water rather than from a deviation from the chemical stoichiometry of the film composition and a dopant added thereto, such as tin. Many experiments relating to the above have been repeatedly carried out, thus resulting in the accomplishment of this invention.

The higher film resistance of the indium oxide conductive films made by the prior processes is caused by the difficulty in providing conductivity caused by absorption of water by the indium oxide conductive films because of lack of or shortage of aqueous vapor in the atmosphere for vacuum evaporation or sputtering. In the prior production processes, it has been considered that aqueous vapor is harmful to the vacuum evaporation or sputtering process and accordingly every effort has been made to remove the vapor. Furthermore, variation of the obtained resistance values is considered to be caused by discharge of the absorbed water from the wall faces of the vacuum evaporation or sputtering chamber and the evaporation material or target material during the vacuum evaporation or sputtering process, and variation of the amount of said absorbed water discharged, according to the conditions prevailing during deposition, thus resulting in changes of the partial pressure of the aqueous vapor. In the process using metallic indium as a starting material, resistance values become especially high in many cases. This occurs because the metal has less dischargeable water than the oxide has.

DETAILED DESCRIPTION OF THE PREFERRED EMBODIMENTS

Some preferred embodiments of this invention will be described below.

Example 1

Aqueous vapor and oxygen are introduced through leak valves into a vacuum evaporation chamber which has been evacuated to $2 \times 10^{-5}$ Torr, resulting in providing respective initial partial pressures (in nitrogen conversion) of aqueous vapor of $3 \times 10^{-5}$ Torr and oxygen of $2 \times 10^{-4}$ Torr. In the resulting atmosphere in said chamber, indium oxide evaporation material mixed with 3% by weight of tin oxide is heated by an electron beam, and thereby vacuum evaporation is effected at an evaporation rate of 100 A/min on a glass plate heated at 350° C to make a film 1500 A thick. According to the above process, indium oxide films having a film resistance of 13 $\Omega$/sq can be made with good reproduceability. If aqueous vapor is not introduced in the vacuum evaporation chamber, the resulting films show variations of film resistance up to five times as high as said value. This is also true in the following examples.

Example 2

Aqueous vapor is introduced through a leak valve into a vacuum evaporation chamber which has been evacuated to $3 \times 10^{-5}$ Torr to provide a partial pressure of aqueous vapor (in nitrogen conversion) of $2 \times 10^{-4}$ Torr. In the resulting atmosphere, an evaporation material of indium oxide powder mixed with 5% by weight of tin oxide is caused to evaporate by electron beam heating and thus the film is vacuum evaporated onto a glass plate heated at 320° C at a rate of 70 A/min to provide an indium oxide conductive film 3000 A thick, which has a film resistance of 7 $\Omega$/sq, and the above process can produce such films with good reproduceability.

Example 3

Aqueous vapor and oxygen are introduced through a leak valve into a vacuum evaporation chamber evacuated to $1 \times 10^{-5}$ Torr to provide respective partial pressures (in nitrogen conversion) of $3 \times 10^{-4}$ Torr oxygen and $1 \times 10^{-4}$ Torr aqueous vapor, and an evaporation material of metallic indium is resistance heated in said tank, thereby causing vacuum evaporation onto a glass plate heated at 350° C at an evaporation rate of 60 A/min to produce an indium oxide conductive film having a film thickness of 1400 A and a resistance of 70 $\Omega$/sq with good reproduceability. In the above examples, aqueous vapor is introduced into a vacuum evaporation tank from the outside through a leak valve; however, it is possible to use other ways to attain the same object, such as introduction of gas, e.g. oxygen, mixed with aqueous vapor by passing it through water, or placing an absorbent such as silica gel having water absorbed therein within the vacuum evaporation tank and heating the absorbent during evaporation, or effective utilization of absorbed water discharged from the wall of vacuum evaporation chamber, thereby generating an appropriate partial pressure of aqueous vapor in the atmosphere of the tank.

This generated or introduced partial pressure of aqueous vapor effective from about $1 \times 10^{-5}$ Torr in nitrogen conversion, and the evaporation can be attained at a partial pressure of aqueous vapor up to $10^{-3}$ Torr. However, even if a partial pressure of aqueous vapor more then necessary is used, any effect such that resistance value of indium oxide conductive film falls below a certain value, is not shown.

A most favourable partial pressure of aqueous vapor within the tank is about $5 \times 10^{-5} \sim 1 \times 10^{-4}$ Torr in nitrogen conversion. Also, when electron beam heating is used, the upper limit of the partial pressure is limited depending on its discharge.

In film production by the sputtering process, shortage of aqueous vapor in the atmosphere produces some increase and variation of the resistance values of indium oxide conductive films, and therefore in order to make low resistance indium oxide conductive films with good reproduceability, aqueous vapor of about the same amount as in the case of vacuum evaporation is mixed in the sputtering atmosphere including argon or a mixture of argon and oxygen of an order of $10^{-4} \sim 10^{-1}$ Torr, as in the vacuum evaporation process.

Also, low resistance indium oxide conductive films made by the present invention have the feature that the transmission factor is lowered greatly in the near infrared range so that it is possible to produce infrared selective indium oxide reflecting films of superior performance with good reproduceability.

The invention is not considered limited to the examples for the purpose of disclosure, and covers all changes and modifications which do not constitute departures from the true spirit and scope of this invention.

What is claimed is:

1. A method of making low resistance indium oxide conductive films on a substrate by a vacuum evaporation or sputtering process using indium oxide or metallic indium as starting material in a chamber having an atmosphere comprising aqueous vapor or gas mixed with aqueous vapor.

2. A method as described in claim 1 whereby the atmosphere for vacuum evaporation or sputtering has a partial pressure of aqueous vapor of about $1 \times 10^{-5} \sim 10^{-3}$ Torr, preferably $5 \times 10^{-5} \sim 1 \times 10^{-4}$ Torr, in nitrogen conversion.

3. A method as claimed in claim 1 wherein the aqueous vapor is introduced into the chamber from external means.

4. A method as claimed in claim 1 wherein the aqueous vapor is generated in situ in the chamber.

* * * * *